United States Patent
Xia et al.

(10) Patent No.: US 9,513,323 B2
(45) Date of Patent: Dec. 6, 2016

(54) ROTARY RESONANT THREE-DIMENSIONAL ELECTRIC FIELD SENSOR

(71) Applicant: INSTITUTE OF ELECTRONICS, CHINESE ACADEMY OF SCIENCES, Beijing (CN)

(72) Inventors: Shanhong Xia, Beijing (CN); Yu Wang, Beijing (CN); Dongming Fang, Beijing (CN); Chunrong Peng, Beijing (CN)

(73) Assignee: Institute of Electronics, Chinese Academy of Science, Beijing (CN)

( * ) Notice: Subject to any disclaimer, the term of this patent is extended or adjusted under 35 U.S.C. 154(b) by 293 days.

(21) Appl. No.: 14/385,410

(22) PCT Filed: Mar. 15, 2013

(86) PCT No.: PCT/CN2013/072708
§ 371 (c)(1),
(2) Date: Sep. 15, 2014

(87) PCT Pub. No.: WO2013/135198
PCT Pub. Date: Sep. 19, 2013

(65) Prior Publication Data
US 2015/0070028 A1     Mar. 12, 2015

(30) Foreign Application Priority Data
Mar. 16, 2012     (CN) .......................... 2012 1 0071769

(51) Int. Cl.
*G01R 29/08*     (2006.01)
*G01R 29/12*     (2006.01)

(52) U.S. Cl.
CPC ............... *G01R 29/08* (2013.01); *G01R 29/12* (2013.01)

(58) Field of Classification Search
CPC ......... G01R 29/08; G01R 29/12; G01R 29/14; H03H 3/007; H03H 3/0072–3/0075; H03H 3/02; H03H 2003/021–2003/028; H03H 9/2405–9/2494
See application file for complete search history.

(56) References Cited

U.S. PATENT DOCUMENTS 6,487,864 B1 *   12/2002   Platt ....................... F25B 21/02
                                                                 62/3.2
7,907,035 B2 *   3/2011   Lutz ......................... H03B 5/30
                                                                 333/186

(Continued)

FOREIGN PATENT DOCUMENTS

EP              2148439 A1 *   1/2010   ......... H03H 9/02259

*Primary Examiner* — Minh N Tang
*Assistant Examiner* — David Frederiksen
(74) *Attorney, Agent, or Firm* — Drinker Biddle & Reath LLP (57) ABSTRACT

A rotary resonant three-dimensional electric field sensor is disclosed. The rotary resonant three-dimensional electric field sensor includes: a substrate (1); an X-direction electric field measurement unit (4), a Y-direction electric field measurement unit (5), and a Z-direction electric field measurement unit (6), set on the substrate (1), each of which including: a sensing electrode (8, 10, 13) fixed on the substrate (1), and a shielding electrode (7, 9, 12) vibrating relatively to the sensing electrode (8, 10, 13); and at least one set of driving mechanical structures (11, 18), is configured to generate a driving force so as to cause the shielding electrode (7, 9) to vibrate relatively to a corresponding sensing electrode (8, 10, 13), and the vibration is transferred to the shielding is electrodes (7, 9, 12) of the other two electric field measurement units (4, 5, 6).

20 Claims, 7 Drawing Sheets

(56) References Cited

U.S. PATENT DOCUMENTS

| | | | |
|---|---|---|---|
| 2004/0113722 A1* | 6/2004 | Bircumshaw | H03H 3/0072 333/197 |
| 2005/0206479 A1* | 9/2005 | Nguyen | H03H 3/0072 333/186 |
| 2009/0195255 A1* | 8/2009 | Kalokitis | G01C 7/04 324/522 |
| 2011/0062968 A1* | 3/2011 | Renno | G01R 29/12 324/654 |

* cited by examiner

ROTARY RESONANT THREE-DIMENSIONAL ELECTRIC FIELD SENSOR

TECHNICAL FIELD

The present invention relates to sensor technology in the electronics industry, and more particularly, to a rotary resonant three-dimensional electric field sensor integrated on a single chip capable of measuring magnitudes of three components of an electric field intensity vector in an environment.

BACKGROUND

Measuring the electric field intensity can be applied in various industries, such as meteorology, aerospace, intelligent power grid, resource prospecting, industrial production, etc. Therefore, electric field sensors with low manufacturing costs and outstanding performance are desired.

Conventionally, an electric field sensor which employs a traditional mechanical structure is able to perform a three-dimensional measurement on electric field intensity. The manufacture of such a sensor has been developed and is of high accuracy. However, its bulky size makes it disadvantageous in application. In "*A Small Three-Dimensional Electric Field Sensor*" (*Journal of Instrumentations and Meters,* 2006, 27(11): 1433-1436, Xing ZHANG, et al.), as a typical example of traditional mechanical sensors, a small three-dimensional electric field sensor is disclosed, which is 5 cm×3.2 cm in size, and weights 80 g.

As the micro-manufacturing technology develops, a micro-manufacturing based micro electric field sensor has been raised. It has a small volume, and is eligible for massive production, and hence, is a potential replacement of the electric field sensor having a traditional mechanical structure. Existing micro electric field sensor is able to perform one-dimensional electric field intensity measurement, and has already got high sensitivity. In "*A High Sensitivity SOI Electric field Sensor with Novel Comb-Shaped Microelectrodes*" (*Transducers'*11, Beijing, 2011, 1034-1037, Pengfei YANG, et al.), as a typical example of such micro electric field sensors, a micro electric field sensor is disclosed, which is 5 mm×5 mm in size, and has a resolution of 40 V/m.

However, during the process of implementing the present invention, the applicant discovers that: in some cases, it is not assured that a direction of electric field intensity is vertical to a surface of sensor, because the direction of the electric field intensity is unknown. And when the direction of the electric field intensity to be measured is not vertical to the surface of the sensor, significant measurement error will arise if the conventional micro electric field sensor is used.

SUMMARY OF THE INVENTION a. Problems to be Solved

The present embodiment provides a rotary resonant three-dimensional electric field sensor, so as to simultaneously measure the magnitudes of the three components of the electric field vector.

b. Technical Solution

According to an aspect of the invention, a rotary resonant three-dimensional electric field sensor is provided. The rotary resonant three-dimensional electric field sensor includes: a substrate; an X-direction electric field measurement unit, a Y-direction electric field measurement unit, and a Z-direction electric field measurement unit provided on the substrate, each of which including: a sensing electrode fixed on the substrate, and a shielding electrode which is able to vibrate relative to the sensing electrode, wherein: the shielding electrode of the Z-direction electric field measurement unit is positioned above its corresponding sensing electrode, and configured to rotationally resonates relative to the corresponding sensing electrode; each of the shielding electrodes of the X-direction electric field measurement unit and the Y-direction electric field measurement unit is connected to the shielding electrode of the Z-direction electric field measurement unit by one terminal respectively, so as to rotationally resonate relative to their corresponding sensing electrodes; wherein the shielding electrode of at least one of the X-direction electric field measurement unit, the Y-direction electric field measurement unit, and the Z-direction electric field measurement unit is connected to an anchor point fixed on the substrate via a beam structure; and at least one set of driving mechanical structures, configured to generate a driving force along a rotary resonating direction for the shielding electrode of one of the X-direction electric field measurement unit and the Y-direction electric field measurement unit, so as to cause the shielding electrode vibrate relative to its corresponding sensing electrode, and cause vibration be transferred to the shielding electrodes of the other two electric field measurement units.

According to a further aspect of the invention, a rotary resonant three-dimensional electric field sensor is provided. The rotary resonant three-dimensional electric field sensor includes: a substrate; an X-direction electric field measurement unit and a Y-direction electric field measurement unit provided on the substrate, each of which including: a sensing electrode fixed on the substrate, and a shielding electrode which is able to vibrate relative to the sensing electrode, wherein: inside terminals of each the shielding electrodes of the X-direction electric field measurement unit and the Y-direction electric field measurement unit are connected together so as to rotationally resonate relative to their respective corresponding sensing electrodes, respectively; an outside terminal of the shielding electrode of at least one of the X-direction electric field measurement unit and the Y-direction electric field measurement unit is connected to an anchor point fixed on the substrate via a beam structure; and at least one set of driving mechanical structures, configured to generate a driving force along the rotary resonating direction for the shielding electrode of one of the X-direction electric field measurement unit and the Y-direction electric field measurement unit, so as to cause the shielding electrode vibrate relative to its corresponding sensing electrode, and cause vibration be transferred to the shielding electrode of the other electric field measurement unit.

c. Beneficial Effects

With the above solutions, the rotary resonant three-dimensional electric field sensor of the present embodiment at least has the advantages as follows.
1) The rotary resonant three-dimensional electric field sensor of the present embodiment integrates electric field measurement units in three directions, thus has a high integration level. Comparing with existing micro one-dimensional electric field sensors, when the electric field to be measured is not vertical to the sensor surface, the sensor of the present embodiment is able to achieve accurate measurement by measuring the magnitudes of the three components of the electric field vector simultaneously.

2) The rotary resonant three-dimensional electric field sensor of the present embodiment requires only one set of stimulating signals to drive the vibration of the electrodes of electric field measurement units in the three directions, which leads to less stimulating signals and less interferences to the electric field which is to be measured. The shielding electrodes of the respective electric field measurement units are connected together to ensure each shielding electrode vibrates uniformly, and hence each sensing electrode output signal has the same resonant frequency.

3) The X-direction, Y-direction electric field measurement unit of the rotary resonant three-dimensional electric field sensor of the present embodiment is respectively arranged in pairs, thus a differential structure is formed to reduce the interferences to the measurement and thereby improve measurement accuracy.

4) The Z-direction electric field measurement unit of the rotary resonant three-dimensional electric field sensor of the present embodiment is configured to rotationally resonate under the driving of other electric field measurement units, which leads to less driving electrodes, lower power consumption and smaller volume.

5) The rotary resonant three-dimensional electric field sensor of the present embodiment is manufactured by utilizing micro manufacturing technology, which is compatible with matured IC technology, and thereby facilitates massive, low cost production. Comparing with traditional three-dimensional electric field sensor, the rotary resonant three-dimensional electric field sensor is preferred for its smaller volume and lower power consumption, and applicable to portable devices.

BRIEF DESCRIPTION OF THE DRAWINGS

FIG. 4 is a diagram of a sensing principle of the Z-direction electric field measurement unit as illustrated in FIG. 3, in which

FIG. 8 is a diagram of a sensing principle of the Y-direction electric field measurement unit as illustrated in FIG. 6, in which

THE DESCRIPTION OF EMBODIMENTS

In order to clarify the object, solution, and advantages of the present embodiment, the present embodiment is further described below in detail, by way of examples, with reference to the drawings.

It is understood that, in the drawings and following description, similar or like parts are referred to with like numbers. In the drawings, the shape and thickness of the embodiments is enlargeable, and could be identified with simplicity and convenience. Moreover, elements and embodiments not depicted or described in the drawings is of forms known by a skilled person in the art. Additionally, although this description may provide examples of parameters with specific values, it should be appreciated that, the parameters may be within acceptable error allowances or design limits, with their values similar to corresponding values, rather than being exactly equal to corresponding values.

Figure 1:
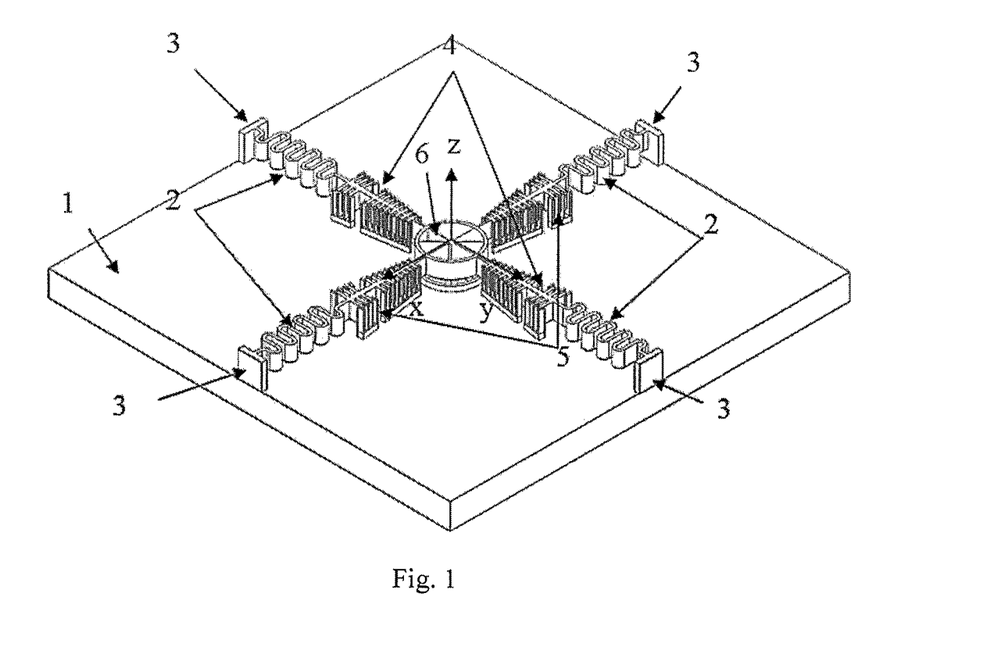
FIG. 1 is a structural diagram of a rotary resonant three-dimensional electric field sensor according to an embodiment of the present invention.

The present embodiment provides a rotary resonant three-dimensional electric field sensor with electric field measurement units of three different dimensions integrated on a single chip. The rotary resonant three-dimensional electric field sensor may drive the vibration of the electrodes in the three electric field measurement units by loading only one set of stimulating signals, and three components of the electric field vector in the environment are measured by the three electric field measurement units sensing variations of an amount of electric charge. First, in order to facilitate understanding, elements of the rotary resonant three-dimensional electric field sensor according to the embodiment are listed below:

1 substrate
2 beam structure
3, 14 anchor point
4 X-direction electric field measurement unit
5 Y-direction electric field measurement unit
6 Z-direction electric field measurement unit
7, 9, 12 shielding electrode
8, 10, 13 sensing electrode
11, 18 driving electrode
15 anchor point
16 shielding electrode
17 V-shaped beam structure In an exemplary embodiment, a rotary resonant three-dimensional electric field sensor is provided. FIG. 1 is a structural diagram of a rotary resonant three-dimensional electric field sensor according to an embodiment of the present invention. As shown in FIG. 1, the rotary resonant three-dimensional electric field sensor according to the present embodiment may include: a substrate 1, an X-direction electric field measurement units 4, a Y-direction electric field measurement units 5, a Z-direction electric field measurement unit 6, and at least one set of driving mechanical structures. The X-direction electric field measurement units 4, the Y-direction electric field measurement units 5, and the Z-direction electric field measurement unit 6 are provided on the substrate 1, for measuring X-direction, Y-direction and Z-direction components of an electric field vector respectively. Each of the driving mechanical structures is used to generate a driving force along the rotary resonating direction for the shielding electrodes of either the X-direction electric field measurement units or the Y-direction electric field measurement units. The shielding electrode of at least one of the X-direction electric field measurement units, the Y-direction electric field measurement units, and the Z-direction electric field measurement unit is connected to an anchor point fixed on the substrate via a beam structure.

Respectively described below in detail are various elements of the rotary resonant three-dimensional electric field sensor according to the present embodiment.

In the embodiment, the substrate 1 is, but not limited to, made of silicon wafer. Alternatively, the substrate 1 may be made of other materials, which possess a certain level of rigidity, and are not prone to deformation.

Referring to FIG. 1, the Z-direction electric field measurement unit 6 is positioned at the center (i.e. origin of coordinates) of the substrate 1. The X-direction electric field measurement units and the Y-direction electric field measurement units are provided surrounding the Z-direction electric field measurement unit 6, and are symmetrical with Z-axis. The X-direction electric field measurement units 4 are arranged along Y-axis, and the Y-direction electric field measurement units 5 are arranged along X-axis on substrate 1.

Because the coordinate axes can be set as desired, an angular requirement is deemed to be satisfied as long as the symmetry axis of the X-direction electric field measurement units 4 and the Y-direction electric field measurement units 5 are spaced by 90 degree. Additionally, the X-direction electric field measurement units 4 and the Y-direction electric field measurement units 5 are interchangeable. For a pair of the X-direction electric field measurement units 4 or the Y-direction electric field measurement units 5, which are symmetrically arranged with Z-axis, both of the electric field measurement units may output measurement signals simultaneously, and form a differential structure. This differential structure of electric field measurement units may reduce the impact of outside interference to the measurement, and improve the measurement accuracy.

Skilled persons in the art should appreciate that, a single X-direction electric field measurement unit 4 or a single Y-direction electric field measurement unit 5 may be used. Although the structural strength and measurement accuracy may be reduced in this case, the effect of simultaneously measuring three components of an electric field vector can be realized.

In the embodiment, each electric field measurement unit may include a shielding electrode, and a sensing electrode fixed on the substrate 1. The shielding electrode of the Z-direction electric field measurement unit 6 is positioned above its corresponding sensing electrode. Each of the shielding electrodes of the X-direction electric field measurement units 4 and the Y-direction electric field measurement units 5 is connected to the shielding electrode 7 of the Z-direction electric field measurement unit 6 by one terminal and connected to an anchor point 3 fixed on the substrate 1 via a beam structure 2 by the other terminal.

Each of the driving mechanical structures is configured to generate a driving force along the rotary resonating direction for the shielding electrode of one of the X-direction electric field measurement units 4 and the Y-direction electric field measurement units 5. Under the stimulation, the driving mechanical structures generate a periodical driving force for the shielding electrodes of their corresponding electric field measuring unit, enabling the shielding electrode to vibrate periodically relative to corresponding sensing electrode, and the periodical vibration of the shielding electrode is transferred to the Z-direction electric field measurement unit 6 connected and the shielding electrodes of other measurement units.

Figure 2A:
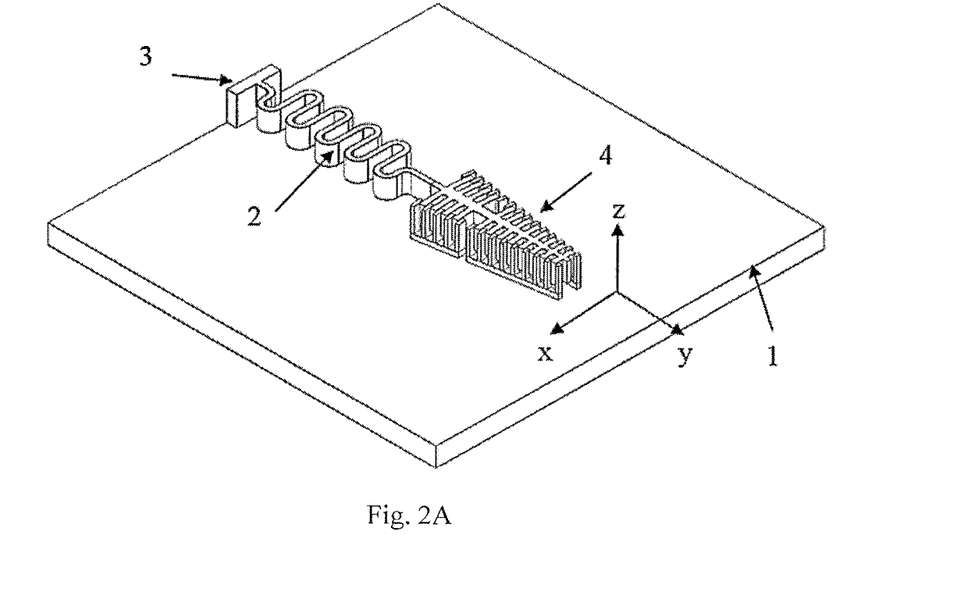
FIGS. 2A and 2B are structural diagrams of a beam structure in the rotary resonant three-dimensional electric field sensor as illustrated in FIG. 1.

The beam structure 2 in FIG. 2A is a snake-shaped beam. The shielding electrode of the X-direction electric field measurement unit 4 is connected to an anchor point 3 fixed on the substrate 1 via the snake-shaped beam, and the axis direction of the symmetry axis of beam structure 2 is perpendicularly arranged to the X-axis. The shielding electrode of the Y-direction electric field measurement unit 5 is connected to an anchor point 3 fixed on the substrate 1 via a beam structure 2, and the axis direction of the symmetry axis of beam structure 2 is parallel with the X-axis. There are four beam structures 4 in total, and the end points 3 of the four beam structures 2 form the four vertexes of a square which is centered at the origin of coordinates.

Figure 2B:
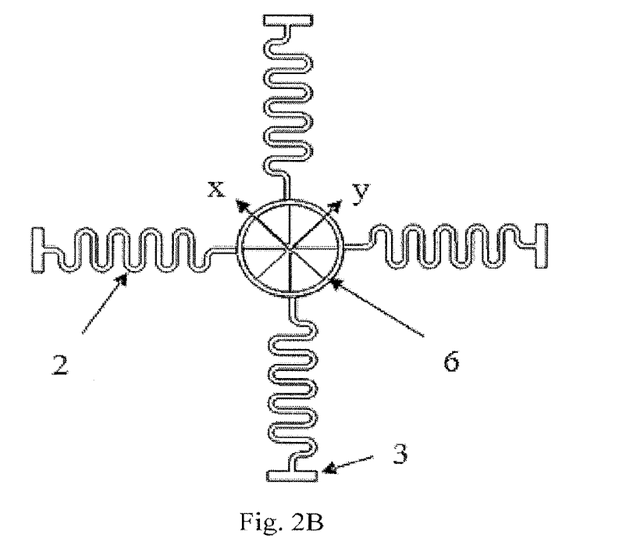

Additionally, the shielding electrode 7 of Z-direction electric field measurement unit 6 may also connect to an anchor point 3 fixed on the substrate 1 via the beam structure 2. In this case, the axis direction of the symmetry axis of beam structure 2 is 45 degree or other angle with respective to the X-axis, as shown in FIG. 2B. That is, the shielding electrode of at least one of the X-direction electric field measurement unit 4, the Y-direction electric field measurement unit 5, and the Z-direction electric field measurement unit 6 is connected to an anchor point 3 fixed on the substrate 1 via a beam structure 2.

The beam structure 2 is elastic along the vibration direction of the shielding electrode of the electric field measurement unit connected to the beam structure 2, with an equivalent rigidity determining an operation mode of the three dimensional electric field sensor, and the like. In addition to the snake-shaped beam, the beam structure 2 may be straight line-shaped, wave-shaped, zigzag-shaped, etc., and its material could be silicon, metal, alloy and the like.

Figure 3:
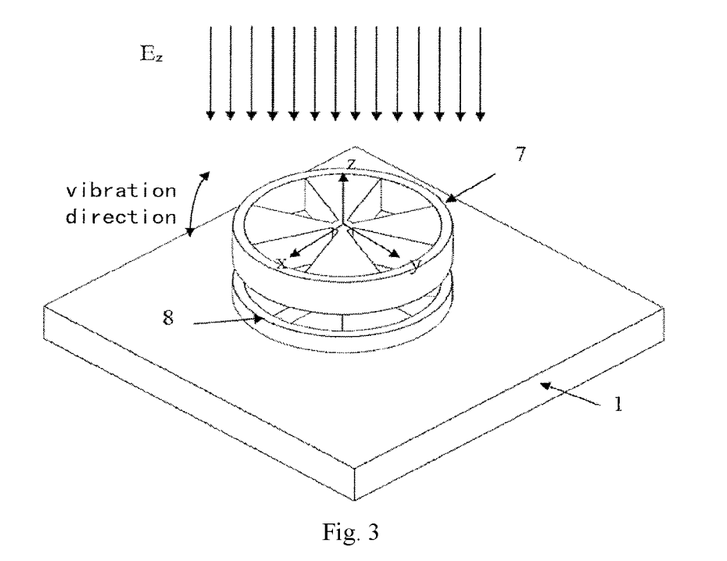
FIG. 3 is a structural diagram of a Z-direction electric field measurement unit in the rotary resonant three-dimensional electric field sensor as illustrated in FIG. 1.

FIG. 3 is a structural diagram of a Z-direction electric field measurement unit 6 in the rotary resonant three-dimensional electric field sensor as illustrated in FIG. 1. Referring to FIG. 1 and FIG. 3, the Z-direction electric field measurement unit 6 may include: a shielding electrode 7 and a sensing electrode 8. The sensing electrode 8 is fixed on substrate 1, and its top surface is parallel to the surface of substrate 1. On the body part of the sensing electrode 8, several openings are formed. This sensing electrode 8 is connected to a signal measurement circuit.

The shielding electrode 7 is located above the sensing electrode 8. The top and bottom surfaces shielding electrode 7 are parallel to the surface of substrate 1, and the axis direction is perpendicular to the surface of substrate 1, There are also several openings formed on the body part of shielding electrode 7, and these openings are arranged alternately with the openings on the sensing electrode 8 to be shielded from each other. An outside frame of the shielding electrode 7 is connected to the shielding electrodes of the X-direction electric field measurement units 4 and the Y-direction electric field measurement units 5. The openings on the sensing electrode 8 and the shielding electrode 7 may be circle, square, fan-shaped, triangle, oval and the like.

Regarding the Z-direction electric field measurement unit 6 as illustrated in FIG. 3, its operation principle may be described in detail. When the three-dimensional electric field sensor is active, the shielding electrode 7 vibrates rotationally under the driving of a periodical force. With the relative position of the shielding electrode 7 and the sensing electrode 8 shown as FIG. 4A, the amount of sensing charges on the sensing electrode 8 is larger; and with the relative position of shielding electrode 7 and sensing electrode 8 shown as FIG. 4B, the amount of sensing charges on the sensing electrode 8 is smaller. The periodical vibration of the shielding electrode 7 relative to the sensing electrode 8 leads to a periodical variation of the amount of the sensing charges on the surface of the sensing electrode 8, and thereby forms an alternating current. Ideally, the three-dimensional electric field sensor is operated at a linear area, and the current is proportional to the Z-direction component of the electric field to be measured. Thus the magnitude of the current may reflect the Z-direction component of the electric field to be measured, and the current is measurable using an appropriate measuring circuit.

Figure 4A:
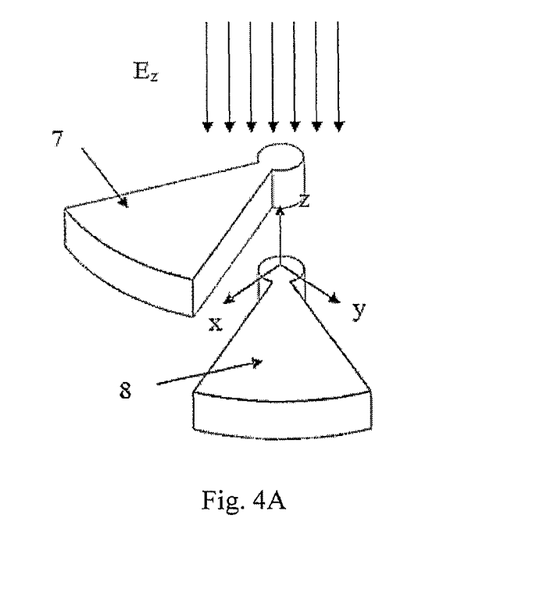
FIG. 4A is a diagram of a weak-shielding state.
Figure 4B:
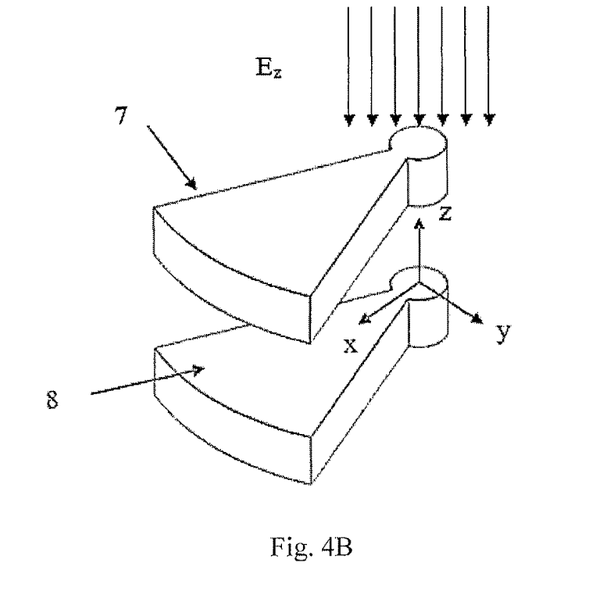
FIG. 4B is a diagram of a strong-shielding state.

As shown in FIG. 3, FIG. 4A and FIG. 4B, in the present embodiment, the number of Z-direction electric field measurement unit 6 is one, and a shielding electrode 7 and a sensing electrode 8 are included. The shielding electrode 7 has several fan-shaped openings which are evenly distributed along the circle, and the sensing electrode 8 also has several fan-shaped openings which are evenly distributed along the circle. A fan-shaped area called shielding structure is formed between two neighboring openings on the body of shielding electrode 7, and a fan-shaped area called sensing structure is formed between two neighboring openings on the body of sensing electrode 8. Accordingly, the shielding structure and the sensing structure are alternately arranged to be shielded from each other. In other preferred embodiments of the present invention, the number of Z-direction electric field measurement unit 6 is more than one, e.g. two. In this case, all shielding structures are divided into two groups, and each group is still evenly distributed along the circle. All sensing structures can be similarly divided into two groups, and each group is combined with a corresponding shielding structure according to the pattern as shown in FIG. 4A and FIG. 4B, thereby forming a complete Z-direction electric field measurement unit 6. The configuration of the two Z-direction electric field measurement units 6 may form a differential structure, which could improve the measuring accuracy.

Figure 5:
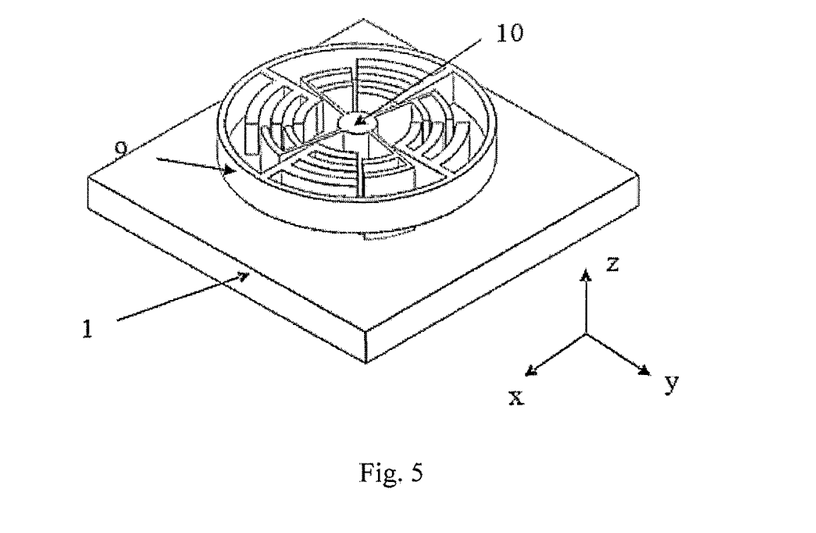
FIG. 5 is a structural diagram of a second type of Z-direction electric field measurement unit in the rotary resonant three-dimensional electric field sensor according to an embodiment of the present invention.

In addition to the above-mentioned structure of Z-direction electric field measurement unit 6, the present embodiment provides other structure of Z-direction electric field measurement unit 6. FIG. 5 is a structural diagram of a second type of Z-direction electric field measurement unit in the rotary resonant three-dimensional electric field sensor according to an embodiment of the present invention. Referring to FIG. 5, Z-direction electric field measurement unit 6 may include a shielding electrode 9 and a sensing electrode 10. The sensing electrode 10 is fixed on substrate 1, and its top surface is parallel to the surface of substrate 1. This sensing electrode 10 is electrically connected to an electrical input of a signal measuring circuit.

The sensing electrode 10 may include one or more spokes centered at the center of the sensor and extending along the radius direction; and comb-shaped structures, each of which is arranged along the angular direction on a spoke. The shape of the combs is a series of co-centered circular arcs, with a co-center coinciding with the origin of coordinates of the rotary resonant three-dimensional electric field sensor according to the embodiment.

The top and bottom surfaces of the shielding electrode 9 are parallel to the surface of substrate 1, and the axis direction of the shielding electrode 9 is perpendicular to the surface of substrate 1. The outside frame of the shielding electrode 9 is connected to the shielding electrodes of the X-direction electric field measurement units 4 and the Y-direction electric field measurement units 5. One or more spokes is arranged radially on the inside of the circular frame of shielding electrode 9. A comb-shaped structure is arranged on each spoke along the angular direction. The shape of the combs is a series of co-centered circular arcs, with a co-center coinciding with the origin of coordinates of the rotary resonant three-dimensional electric field sensor according to the embodiment. The comb-shaped structure of shielding electrode 9 and the comb-shaped structure of the above sensing electrode 10 are arranged alternately with each other.

Regarding the Z-direction electric field measurement unit 6 in the three-dimensional electric field sensor according to the embodiment of the present invention as illustrated in FIG. 5, when the three-dimensional electric field sensor is active, the shielding electrode 9 vibrates rotationally under the driving of a periodical force, and the relative position of the shielding electrode 9 and the sensing electrode 10 varies periodically, thereby the amount of the charges on the surface of the sensing electrode 10 varies periodically to form a alternating current. Ideally, the three-dimensional electric field sensor operates at the linear area, and the current is proportional to the Z-direction component of the electric field to be measured. Then the magnitude of the current may reflect the Z-direction component of the electric field to be measured, and the current is measurable using the appropriate signal measuring means.

In the present embodiment, the driving mechanical structures may be driven by electrostatic forces. Electric field measuring units connected to the electrostatically driving mechanical structures are described below. In the embodiment, the shielding electrodes of both X-direction electric field measurement units 4 and Y-direction electric field measurement units 5 are simultaneously driven by the electrostatic forces. It is noted that, although the X-direction electric field measurement units 4 and Y-direction electric field measurement units 5 are separately positioned, they are identical in structure. Therefore, only the Y-direction electric field measurement units 5 are described below for clarity.

Figure 6:
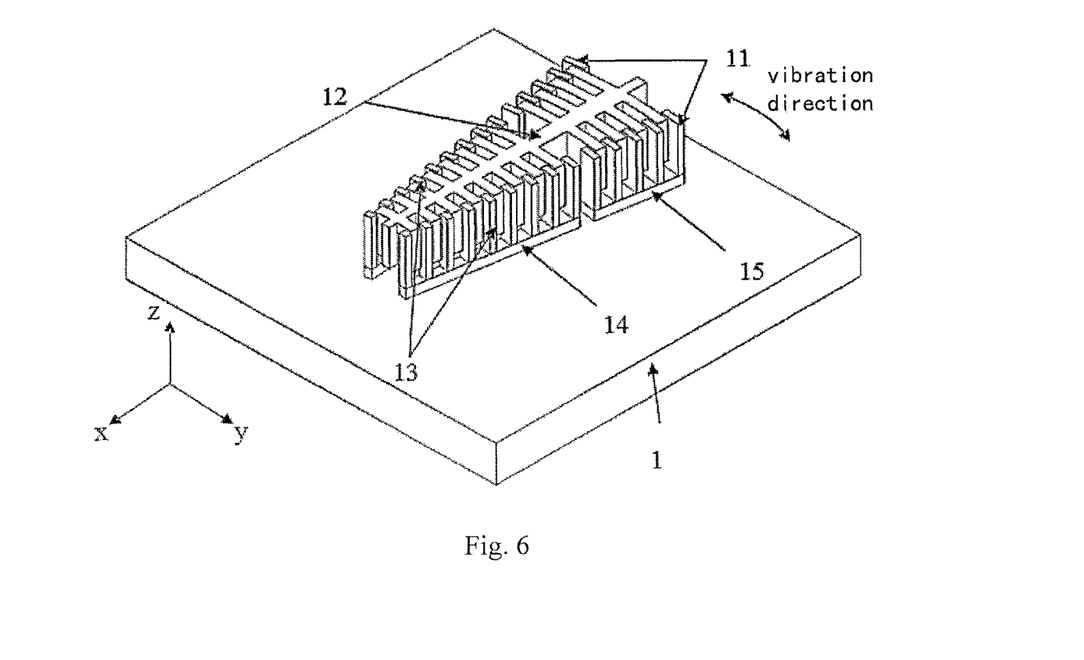
FIG. 6 is a structural diagram of a Y-direction electric field measurement unit and a driving mechanical structure in the rotary resonant three-dimensional electric field sensor as illustrated in FIG. 1.

FIG. 6 is a structural diagram of a Y-direction electric field measurement unit 5 and a mechanical structure in the rotary resonant three-dimensional electric field sensor as illustrated in FIG. 1. As shown in FIG. 6, a Y-direction electric field measurement unit 5 may include a shielding electrode 12 and a sensing electrode 13.

The shielding electrode 12 is a mirror-symmetrical comb-shaped structure, in which the shape of the comb is a series of co-centered circular arcs, with a corresponding co-center coinciding with the center of the sensor. One terminal of the shielding electrode 12 is connected to the shielding electrode 7 of Z-direction electric field measurement unit 6, and the other terminal is connected to the beam structure 2. According to the embodiment, in the shielding electrode 12, a comb-shaped part in a near end along the radial direction to the center of Z-direction electric field measurement unit 6 is called the first part, and the comb-shaped part in a far end is called the second part.

The sensing electrode 13 fixed on the substrate 1 via an anchor point 14, is a comb-shaped structure, and the length of its comb-shaped structure is shorter than the length of the comb-shaped structure of the shielding structure 12. The shape of the comb is a series of co-centered circular arcs, with a corresponding co-center coinciding with the center of the sensor. The comb-shaped structure of the sensing electrode 13 and the first part of the comb-shaped structure of the shielding electrode 12 are arranged alternately, with a constant interval between the neighboring combs. A pair of sensing electrodes 13 is symmetrically arranged on both sides of the shielding electrode 12, and electrically connects to the signal measuring circuit respectively. The top surfaces of both the shielding electrode 12 and the sensing electrode 13 are parallel to the surface of substrate 1.

Additionally, in other embodiments of the present invention, a single sensing electrode 13 may provided at only one side of the shielding electrode 12. In this case, the shielding electrode 12 only keeps the comb-shaped structure on the side where the single sensing electrode 13 is provided.

Figure 7:
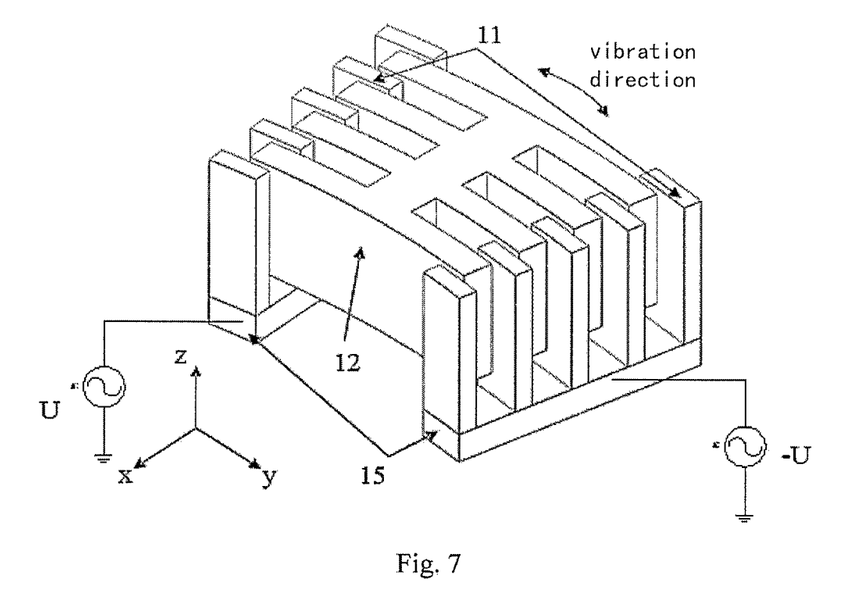
FIG. 7 is a partial enlargement diagram of the Y-direction electric field measurement unit and the driving mechanical structures as illustrated in FIG. 6.

FIG. 7 is a partial enlargement diagram of the Y-direction electric field measurement unit 5 and the mechanical structures as illustrated in FIG. 6. Referring to FIG. 7, the driving mechanical structures may include two sets of separate driving electrodes 11 which are symmetrically arranged on both sides of the shielding electrode 12. The driving electrodes 11 are fixed on the substrate 1 via an anchor point 15. The sensing electrode 13 is a comb-shaped structure, and the shape of the comb is a series of co-centered circular arcs, with a corresponding co-center coinciding with the center of the sensor. The driving electrodes 11 and the second part of the comb-shaped structure of the shielding electrode 12 are arranged alternately, with the consistent interval between the neighboring combs.

Figure 8A:
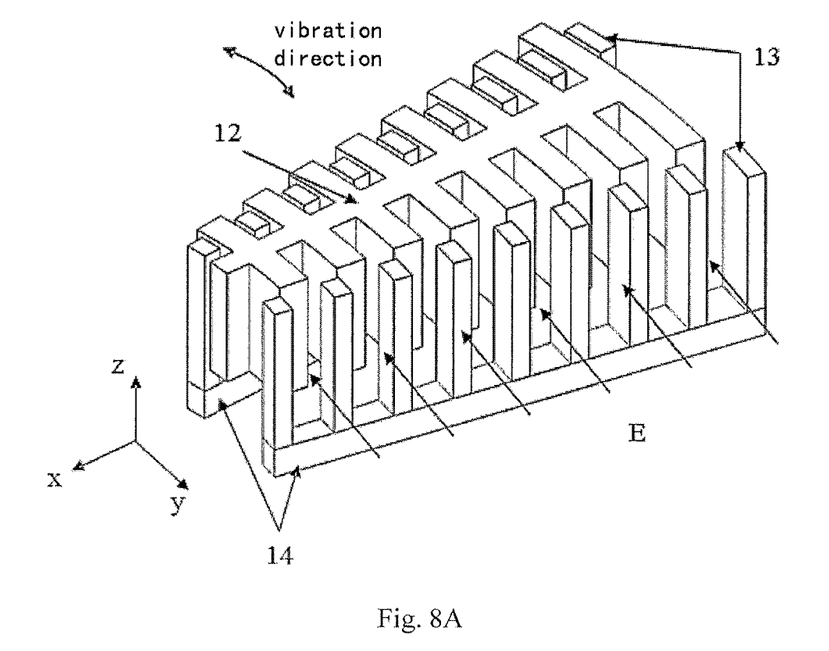
FIG. 8A is a diagram of a first state and FIG. 8B is a diagram of a second state.
Figure 8B:
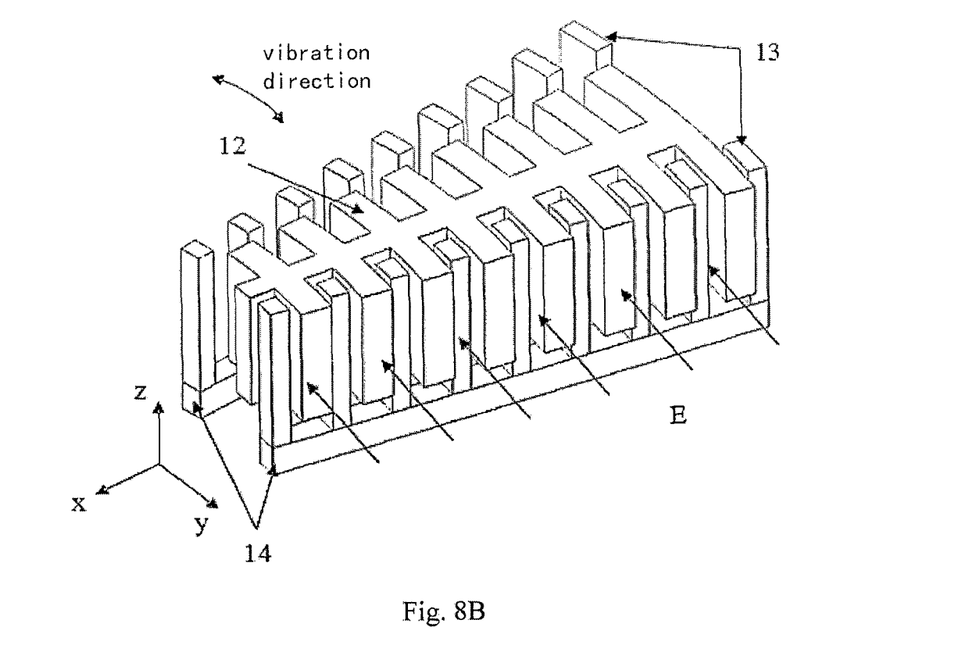

The operation principle of the Y-direction electric field measurement unit 5 and the driving electrodes 11 shown in FIG. 7 is described below. When the sensor is active, the driving electrodes on both sides introduce two stimulating signals respectively. The signals have the same magnitudes and frequencies, but their phases differ by 180 degree. The stimulating signals generate a combined force along the angular direction for the shielding electrode 12 so that the shielding electrode 12 vibrates rotationally and periodically under the driving of this electrostatic force. When the relative position relationship of the shielding electrode 12 and the sensing electrode 13 is shown as FIG. 8A, the Y-direction electric field measurement unit 5 is in a first operation state: on a positive value side of the Y-axis, the amount of charges on the surface of the sensing electrode is larger, and on a negative value side of the Y-axis, the amount of charges on the surface of the sensing electrode is smaller. When the relative position relationship of the shielding electrode 12 and the sensing electrode 13 is shown as FIG. 8B, the Y-direction electric field measurement unit 5 is in a second operation state: on the positive value side of the Y-axis, the amount of charges on the surface of the sensing electrode is smaller, and on the negative value side of the Y-axis, the amount of charges on the surface of the sensing electrode is larger. The relative position relationship between the shielding electrode 12 and the sensing electrode 13 varies periodically, leading to a periodical variation of the amount of the charges on the surface of the sensing electrode 13, and thereby forms a current. Ideally, the three-dimensional electric field sensor operates at the linear area, and the current is proportional to the Y-direction component of the electric field to be measured. The current is measurable using the appropriate signal measuring circuit. The operation principle of the X-direction electric field measurement unit 4 is the same as that of the Y-direction electric field measurement unit 5, hence are not be repeated here for clarity.

Referring to FIG. 6, in the embodiment, the driving electrodes 11 are arranged on the outside of the sensing electrode 13 along the radial direction, and are symmetrically distributed in pairs on both sides of the shielding electrode 12 to enhance the driving force and the driving torque. However, in other embodiments of the present invention, the driving electrodes 11 may interchange their positions with the sensing electrodes 13, and the driving electrodes 11 may be not arranged in pairs on both sides of the shielding electrode 12, but rather on only one side of the shielding electrode 12, as long as the effect of driving the shielding electrode can be realized.

Additionally, other driving manner may be employed in addition to the above-mentioned electrostatic driving manner, such as, thermally driving, electro-magnetic driving, piezoelectric driving, or shape memory alloy and the like. Regardless the driving electrodes employed, a general functionality shall be implemented so that the driving electrodes may provide the driving forces to drive the corresponding shielding electrodes in motion.

Figure 9:
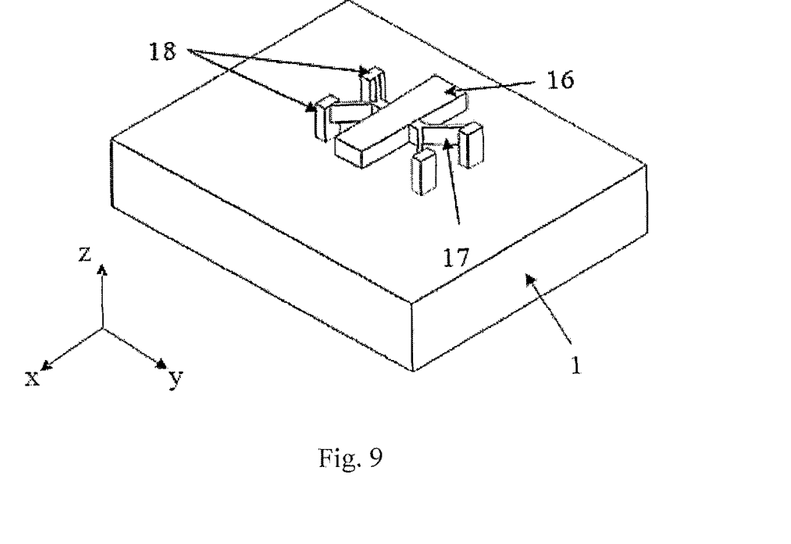
FIG. 9 is diagram of a thermally driving mechanical structure in the rotary resonant three-dimensional electric field sensor according to an embodiment of the present invention.

FIG. 9 is diagram of a thermally driving mechanical structure in the rotary resonant three-dimensional electric field sensor according to an embodiment of the present invention. As shown in FIG. 9, two separated sets of thermally driving mechanical structures are symmetrically arranged on both sides of a shielding electrode 16. Each set may include: two driving electrodes 18, which are electrically connected to two inputs for inputting the driving signals respectively, and a V-shaped beam structure 17, which is connected between the two driving electrodes 18 and the shielding electrode 16 and is made of thermal inflatable material. The driving electrodes 18 are fixed on substrate 1, and are connected to the V-shape beam structure 17, which in turn is connected to the shielding electrode 16. The principle for driving the shielding electrode with the above-mentioned thermally driving mechanical structures is described as below. The driving mechanical structures on both sides of the shielding electrode 16 respectively load AC voltage signals, which are of the same magnitude and frequency but separated in phase by 180 degree. Under the alternating signals, the V-shaped beam structure 17 thermally inflates and contracts periodically so that thermal stress may drive the shielding electrode 16 to move back and forth.

The relative position of the shielding electrode 16 and the sensing electrode varies periodically, and thereby the amount of the charges on the surface of the sensing electrode varies periodically to form an alternating current. This current may reflect the intensity of Y-direction component of the electric field to be measured, and the current is measurable using appropriate signal measuring circuit. Preferably, two sets of driving mechanical structures are arranged on both sides of the shielding electrode 16 to enhance the driving force. It should be understood that, the present embodiment may also be implemented if there is only one set of driving mechanical structures or a plurality of sets of driving mechanical structures are arranged on the same side of shielding electrode 16.

Additionally, it is noted that, in the present embodiment (referring also to FIG. 1), there is only one Z-direction electric field measurement unit 6, and a pair of X-direction electric field measurement units 4 and a pair of Y-direction electric field measurement units 5 are symmetrically distributed on both sides of the Z-axis respectively. In other preferred embodiments of the invention, there may be two or more alternately positioned Z-direction electric field measurement units 6, with their axial direction coinciding with Z-axis. A plurality of pairs of X-direction electric field measurement units 4 and a plurality of pairs of Y-direction electric field measurement units 5 may be symmetrically distributed on both sides of the Z-axis respectively, and each pair forms a differential structure. In these embodiments, within the half plane on the positive axis side of the X-axis, the X-direction electric field measurement units 4 are axisymmetrically arranged with the positive axis of the X-axis as a symmetry axis, and within the half plane on the negative axis side of the X-axis, the X-direction electric field measurement units 4 are axisymmetrically arranged with the negative axis of the X-axis as a symmetry axis. Within the half plane on the positive axis side of the Y-axis, the Y-direction electric field measurement units 5 are axisymmetrically arranged with the positive axis of the Y-axis as a symmetry axis, and within the half plane on the negative axis side of the Y-axis, the Y-direction electric field measurement units 5 are axisymmetrically arranged with the negative axis of the Y-axis as a symmetry axis.

Persons skilled in the art should understand that, X-direction electric field measurement units 4, Y-direction electric field measurement units 5 and Z-direction electric field measurement units 6 may be made of materials which are chosen from silicon, metal, and alloys, etc. The manufacturing process of such measurement units could be electroplating, electroforming, silicon-surface manufacture technology, EFAB technology, and PolyMUMPs and MetalMUMPs technologies of MEMSCAP Company, etc. The relevant technologies are well known to the persons skilled in the art and will not be repeated herein.

The rotary resonant three-dimensional electric field sensor according to the present embodiment has been described in detail with reference to the drawings.

According to boundary conditions of Maxwell Equations, electric field vectors bend at the surface of the electric sensor. In practice, the X-direction electric field measurement unit 4 may simultaneously sense X-component, Y-component and Z-component of an electric field to be measured. That is, an output signal of the X-direction electric field measurement unit 4 may contain responses to the X-component, Y-component and Z-component of the electric field to be measured, and a certain quantitative relationship is presented among these three components to form the output signal of the X-direction electric field measurement unit 4. Similar situation occurs for the Y-direction electric field measurement unit 5. Therefore, the output of X-direction and Y-direction electric field measurement unit both contain a response to the Z-component of the electric field to be measured. The magnitude of the Z-component could be computed based on the quantitative relationship of these three parts of responses. In this case, the Z-direction electric field measurement unit may be omitted.

Figure 10:
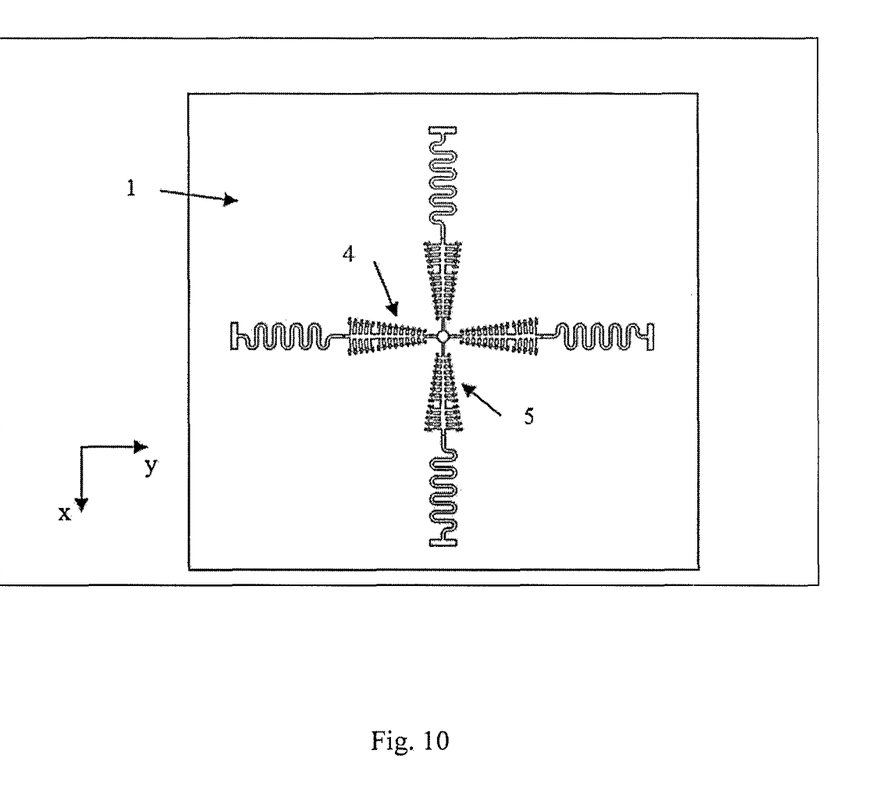
FIG. 10 is a top view of a rotary resonant three-dimensional electric field sensor according to another embodiment of the present invention.

Based on the above theory, in another exemplary embodiment of the present invention, another rotary resonant three-dimensional electric field sensor is provided. As shown in FIG. 10, the rotary resonant three-dimensional electric field sensor according to the present embodiment may include: a substrate 1, X-direction electric field measurement units 4, Y-direction electric field measurement units 5, and at least one set of driving mechanical structures. The X-direction electric field measurement units 4 and the Y-direction electric field measurement units 5 are positioned on the substrate, and each of them may include: a sensing electrode fixed on the substrate, and a shielding electrode which is able to vibrate relative to the sensing electrode. The inside terminals of the shielding electrodes of the X-direction electric field measurement units 4 and the Y-direction electric field measurement units 5 are connected together, and the shielding electrodes may rotationally resonate relative to their respective corresponding sensing electrodes, respectively. An outside terminal of the shielding electrode of at least one of the X-direction electric field measurement units 4 and the Y-direction electric field measurement units 5 is connected to an anchor point fixed on the substrate via a beam structure. At least one set of driving mechanical structures generates a driving force along the rotary resonating direction for the shielding electrode of one of the X-direction electric field measurement units 4 and the Y-direction electric field measurement units 5, causing the shielding electrode vibrates relative to its corresponding sensing electrode, and causing the vibration be transferred to the shielding electrode of the other electric field measurement unit.

The rotary resonant three-dimensional electric field sensor according to the present embodiment may include one or more pairs of X-direction electric field measurement units 4 and one or more pairs of Y-direction electric field measurement units 5, each pair of X-direction electric field measurement units 4 form a differential structure, and each pair of Y-direction electric field measurement units 5 form a differential structure.

Other structural features of the present embodiment is similar to relevant description of the above embodiment, thus will not be repeated. According to the above two embodiments, persons skilled in the art should clearly understand the rotary resonant three-dimensional electric field sensor according to the present embodiment.

Additionally, the definitions of the above elements are not limited to the specific structures or shapes mentioned in the embodiments, and persons skilled in the art may easily and familiarly replace them, for example:

(1) Anchor points 3, 14, 15 may be a structure of any shape used to fix and support effectively, and the anchor points may be made of materials which are conductive and no easily deformed, such as silicon, metal, alloy and the like. The anchor point 15 may be positioned right below driving electrode 11 or laterally to the driving electrode 11, as long as it connects the comb of the driving electrode 11 and fix it to substrate 1.

(2) The outside frames of the shielding electrodes 7, 8, 9 may be rectangular, circle, fan-shaped, oval and the like, and are not limited to the circle shape in the above embodiments.

(3) Tips of the comb-shaped structure of the shielding electrodes 9, 12, the sensing electrodes 10, 13 and the driving electrode 11 may be rectangular, circle, T-shaped, stair-shaped and the like.

(4) The shape of the driving electrode 18 in the thermally driving mechanical structures could be rectangular, circle and the like.

From above, the present embodiment provides a rotary resonant three-dimensional electric field sensor, which may be manufactured utilizing micro-manufacturing technologies and is able to realize a three dimensional an measurement of an electric field. Even if the electric field to be measured is not vertical to the sensor surface, the sensor of the present embodiment is able to achieve accurate measurement of the electric field. Therefore, the present embodiment is widely applicable in various industries, such as meteorology, intelligent power grid, resource prospecting, etc.

The above embodiments further explain the object, technical solutions and benefits of the present embodiment. It should be understood that these contents are merely specific embodiments of the invention, thus are not to limit the invention. Any modification, equivalent substitution, or improvement to the contents should be included in the protection scope of the invention, as long as they do not depart from the spirits and principles of the invention.

What is claimed is:

1. A rotary resonant three-dimensional electric field sensor comprising:
a substrate;
an X-direction electric field measurement unit, a Y-direction electric field measurement unit, and a Z-direction electric field measurement unit provided on the substrate, each of which including: a sensing electrode fixed on the substrate, and a shielding electrode which is able to vibrate relative to the sensing electrode, wherein:
the shielding electrode of the Z-direction electric field measurement unit is set above a corresponding sensing electrode, so as to rotationally resonate relative to the corresponding sensing electrode;
the shielding electrodes of the X-direction electric field measurement unit and the Y-direction electric field measurement unit are connected to the shielding electrode of the Z-direction electric field measurement unit by one terminal respectively so as to rotationally resonate relative to respective corresponding sensing electrodes;
the shielding electrode of at least one of the X-direction electric field measurement unit, the Y-direction electric field measurement unit, and the Z-direction electric field measurement unit is connected to an anchor point fixed on the substrate via a beam structure; and
at least one set of driving mechanical structures configured to generate a driving force along a resonating direction for the shielding electrode of one of the X-direction electric field measurement unit and the Y-direction electric field measurement unit, so as to cause the shielding electrode vibrate relative to its corresponding sensing electrode, and cause vibration be transferred to the shielding electrodes of the other electric field measurement units.

2. A rotary resonant three-dimensional electric field sensor according to claim 1, further comprising:
one or more of the Z-direction electric field measurement units, arranged around Z-axis;
one or more pairs of the X-direction electric field measurement units, symmetrically arranged on both sides of the Z-direction electric field measurement units, wherein each pair of the X-direction electric field measurement units forms a differential structure; and
one or more pairs of the Y-direction electric field measurement units, symmetrically arranged on both sides of the Z-direction electric field measurement units, wherein each pair of the Y-direction electric field measurement units forms a differential structure.

3. A rotary resonant three-dimensional electric field sensor according to claim 2, further comprising:
a Z-direction electric field measurement unit;
one pair of the X-direction electric field measurement units, symmetrically arranged along Y-axis on both sides of the Z-direction electric field measurement unit, wherein the pair of X-direction electric field measurement units forms a differential structure connected to a signal measurement circuit;
one pair of the Y-direction electric field measurement units, symmetrically arranged along X-axis on both sides of the Z-direction electric field measurement unit, wherein the pair of Y-direction electric field measurement units forms a differential structure connected to a signal measurement circuit.

4. A rotary resonant three-dimensional electric field sensor according to claim 1, wherein, the beam structure is straight line-shaped, snake-shaped, wave-shaped, or zigzag-shaped.

5. A rotary resonant three-dimensional electric field sensor according to claim 1, wherein, in the Z-direction electric field measurement unit,
one or more openings are arranged on the body part of the sensing electrode;
an outside frame of the shielding electrode is connected to the shielding electrodes of the X-direction electric field measurement unit and the Y-direction electric field measurement unit, and one or more openings are arranged on the body part of the shielding electrode alternately with the openings on the sensing electrode to be shielded each other.

6. A rotary resonant three-dimensional electric field sensor according to claim 5, characterized in that, the shape of the openings is circle, square, fan-shaped, triangle, or oval.

7. A rotary resonant three-dimensional electric field sensor according to claim 1, wherein, in the Z-direction electric field measurement unit,
one or more spokes are provided along a radius direction of the sensing electrode, and comb-shaped structures are provided on the spokes along an angular direction;
the outside frame of the shielding electrode is connected to the shielding electrodes of the X-direction electric field measurement unit and the Y-direction electric field measurement unit, one or more spokes are arranged radially inward on the outside frame, and a comb-shaped structure is arranged on each spoke along the angular direction, wherein the comb of the shielding electrode and the comb of the sensing electrode are configured to arranged alternately with each other.

8. A rotary resonant three-dimensional electric field sensor according to claim 5, wherein, the outside frame of the shielding electrode is rectangular, circle, fan-shaped, or oval.

9. A rotary resonant three-dimensional electric field sensor according to claim 1, wherein, in each of the X-direction electric field measurement unit and the Y-direction electric field measurement unit,
the sensing electrode is a comb-shaped structure;
the shielding electrode is a comb-shaped structure, wherein the comb of the shielding electrode and the comb of the sensing electrode are arranged alternately with each other.

10. A rotary resonant three-dimensional electric field sensor according to claim 9, wherein, the shielding electrode is mirror-symmetrical comb-shaped structure; and said sensing electrodes are symmetrically arranged on both sides of the shielding electrode.

11. A rotary resonant three-dimensional electric field sensor according to claim 9, wherein, in the shielding electrode and the sensing electrode:
the shape of the comb is a series of co-centered circular arcs, with a corresponding co-center coinciding with the center of the rotary resonant three-dimensional electric field sensor.

12. A rotary resonant three-dimensional electric field sensor according to claim 9, wherein, tips of the comb of the comb-shaped structure are rectangular, circle, T-shaped, or stair-shaped.

13. A rotary resonant three-dimensional electric field sensor according to claim 9, wherein, the driving mechanical structures is an electrostatic driving mechanism;

the comb-shaped structure of the shielding electrode is longer than the comb-shaped structure of the sensing electrode in length, and a first part of the comb-shaped structure of the shielding electrode and the comb-shaped structure of the sensing electrode are arranged alternately with each other;

the electrostatic driving mechanical structure includes: a driving electrode fixed on the substrate via an anchor point, the driving electrode is a comb-shaped structure, and the shape of the comb is a series of co-centered circular arcs, with a corresponding co-center coinciding with the center of the sensor, and the driving electrode and the second part of the comb-shaped structure of the shielding electrode are arranged alternately with each other.

14. A rotary resonant three-dimensional electric field sensor according to claim 1, wherein, the driving mechanical structure is: an electrostatic driving mechanism, a thermally driving mechanism, an electro-magnetic driving mechanism, a piezoelectric driving mechanism, or a shape memory alloy driving mechanism.

15. A rotary resonant three-dimensional electric field sensor according to claim 14, wherein, the thermally driving mechanical structure includes:
two driving electrodes electrically connected to two inputs for driving signals respectively;
a V-shaped beam structure connected between the two driving electrodes and the shielding electrode, and the V-shaped beam structure is made of thermal inflatable material, so as to inflate and contract when alternating current is applied to the two driving electrodes, thereby to drive the shielding electrode to vibrate relative to the sensing electrode.

16. A rotary resonant three-dimensional electric field sensor according to claim 15, wherein, two said thermally driving mechanical structures are symmetrically arranged on both sides of a shielding electrode.

17. A rotary resonant three-dimensional electric field sensor according to claim 1, wherein, the beam structure, the driving mechanical structures, the X-direction electric field measurement unit, the Y-direction electric field measurement unit, and the Z-direction electric field measurement unit are integrated on a single chip.

18. A rotary resonant three-dimensional electric field sensor according to claim 1, wherein, the substrate is made of materials comprising silicon, glass, metal, or alloy; and the X-direction electric field measurement unit, the Y-direction electric field measurement unit and the Z-direction electric field measurement unit are made of materials like silicon, metal, or alloy.

19. A rotary resonant three-dimensional electric field sensor comprising:
a substrate;
an X-direction electric field measurement unit and a Y-direction electric field measurement unit, provided on the substrate, each of which including: a sensing electrode fixed on the substrate, and a shielding electrode which is able to vibrate relative to the sensing electrode, wherein:
inside terminals of the shielding electrodes of the X-direction electric field measurement unit and the Y-direction electric field measurement unit are connected together so that the shielding electrodes rotationally resonate relative to their respective corresponding sensing electrodes;
an outside terminal of the shielding electrode of at least one of the X-direction electric field measurement unit and the Y-direction electric field measurement unit is connected to an anchor point fixed on the substrate via a beam structure; and
at least one set of driving mechanical structures, configured to generate a driving force along a resonating direction for the shielding electrode of one of the X-direction electric field measurement unit and the Y-direction electric field measurement unit, so as to cause the shielding electrode vibrate relative to its corresponding sensing electrode, and cause vibration be transferred to the shielding electrode of the other electric field measurement unit.

20. A rotary resonant three-dimensional electric field sensor according to claim 19, further comprising:
one or more pairs of the X-direction electric field measurement units, symmetrically arranged, wherein each pair of the X-direction electric field measurement units forms a differential structure; and
one or more pairs of the Y-direction electric field measurement units, symmetrically arranged, wherein each pair of the Y-direction electric field measurement units forms a differential structure.

\* \* \* \* \*